(12) United States Patent
Cavegn et al.

(10) Patent No.: US 7,857,631 B2
(45) Date of Patent: Dec. 28, 2010

(54) SOCKET WITH A HOUSING WITH CONTACTS WITH BEAMS OF UNEQUAL LENGTHS (75) Inventors: Martin Cavegn, Lino Lakes, MN (US); Gregory D. Spanier, Shakopee, MN (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 12/640,863

(22) Filed: Dec. 17, 2009

(65) Prior Publication Data

US 2010/0167559 A1 Jul. 1, 2010

Related U.S. Application Data (60) Provisional application No. 61/141,477, filed on Dec. 30, 2008.

(51) Int. Cl.
*H01R 12/00* (2006.01)
(52) U.S. Cl. ........................................ 439/65
(58) Field of Classification Search .................. 439/65, 439/66–69, 83, 637, 260
See application file for complete search history.

(56) References Cited

U.S. PATENT DOCUMENTS

| | | | | |
|---|---|---|---|---|
| 5,044,992 | A * | 9/1991 | Dzwonczyk et al. | ... 439/607.09 |
| 5,746,608 | A * | 5/1998 | Taylor | ........................ 439/70 |
| 5,913,687 | A | 6/1999 | Rathburn | |
| 6,178,629 | B1 | 1/2001 | Rathburn | |
| 6,247,938 | B1 | 6/2001 | Rathburn | |
| 6,409,521 | B1 | 6/2002 | Rathburn | |
| 6,533,590 | B1 | 3/2003 | Lee et al. | |
| 6,623,284 | B1 * | 9/2003 | Korsunsky | ................... 439/83 |
| 6,830,460 | B1 | 12/2004 | Rathburn | |
| 6,939,143 | B2 | 9/2005 | Rathburn | |
| 6,957,963 | B2 | 10/2005 | Rathburn | |
| 7,114,960 | B2 | 10/2006 | Rathburn | |
| 7,121,839 | B2 | 10/2006 | Rathburn | |
| 7,160,119 | B2 | 1/2007 | Rathburn | |

(Continued)

FOREIGN PATENT DOCUMENTS

WO 2007109608 A2 9/2007

OTHER PUBLICATIONS

International Search Report and Written Opinion issued in PCT/US2009/069647, mailed Apr. 7, 2010, 12 pages.

*Primary Examiner*—Chandrika Prasad
(74) *Attorney, Agent, or Firm*—Faegre & Benson LLP (57) ABSTRACT

A socket assembly includes a housing with a plurality of through openings that extend between opposite surfaces of the housing. First and second plurality of contact members are positioned in a plurality of the through openings. The contact members each include major beams and minor beams with proximal ends attached to a center portion, and distal ends extending away from the center portion. The major beams preferably have a length greater than the minor beams. When the first circuit member is engaged with the socket assembly the ball grid array displaces the distal ends of the major beams to create a plurality of first and second forces. The first plurality of forces generally oppose the second plurality of forces. The first and second plurality of forces also generate an engagement force that biases the first circuit member toward the housing. The minor beams on the first and second plurality of contact members do not contribute to the engagement force.

17 Claims, 8 Drawing Sheets

U.S. PATENT DOCUMENTS

| | | |
|---|---|---|
| 7,297,003 B2 | 11/2007 | Rathburn |
| 7,326,064 B2 | 2/2008 | Rathburn |
| 7,422,439 B2 | 9/2008 | Rathburn et al. |
| 7,771,209 B2 * | 8/2010 | Chang ........................ 439/66 |
| 2006/0035485 A1 * | 2/2006 | Jaquette et al. ............... 439/66 |
| 2010/0167559 A1 * | 7/2010 | Cavegn et al. ................ 439/65 |

* cited by examiner

SOCKET WITH A HOUSING WITH CONTACTS WITH BEAMS OF UNEQUAL LENGTHS

CROSS-REFERENCE TO RELATED APPLICATION

This application claims priority to Provisional Application No. 61/141,477, filed Dec. 30, 2008, which is herein incorporated by reference in its entirety.

FIELD OF THE INVENTION

The present invention is directed to a high performance socket with a low insertion force for a BGA device.

BACKGROUND OF THE INVENTION

High performance integrated circuits are driving the demand for high performance sockets, such as those disclosed herein and in U.S. Pat. Nos. 6,247,938; 6,409,521; 6,939,143; 6,957,963; 6,830,460; 7,114,960; 7,121,839; and 7,160,119, which are hereby incorporated by reference. As bus architectures become increasingly complex the frequency of the signals is much higher and more sensitive to changes in impedance. Next generation systems are running at about 5 GHz. High performance sockets, such as those identified above, have decreased pin pitch from about 1 millimeter ("mm") to from between about 0.4 mm and about 0.5 mm and pin count is increasing.

BRIEF SUMMARY OF THE INVENTION

The present invention is directed to a high performance socket for a BGA device with a low insertion force. The present socket assembly is adapted to electrically couple a first circuit member to contact members along a first side of a socket assembly, and a second circuit member to the contact members along a second side of the socket assembly.

The socket assembly includes a housing with a plurality of through openings that extend between opposite surfaces of the housing. A first plurality of contact members are positioned in a plurality of the through openings. The first plurality of contact members each include major beams and minor beams with proximal ends attached to a center portion, and distal ends extending away from the center portion. The major beams preferably have a length greater than the minor beams. When the first circuit member is engaged with the socket assembly the ball grid array displaces the distal ends of the major beams of the first plurality of contact members to create a plurality of first forces. A second plurality of contact members are positioned in a plurality of the through openings. The second plurality of contact members each include major beams and minor beams. When the first circuit member is engaged with the socket assembly the ball grid array displaces the distal ends of the major beams of the second plurality of contact members to create a plurality of second forces. The first plurality of forces generally oppose the second plurality of forces. The first and second plurality of forces also generate an engagement force that biases the first circuit member toward the housing. The minor beams on the first and second plurality of contact members do not contribute to the engagement force.

The contact members can be arranged in a variety of configurations to create one or more pairs of opposing forces. For example, the socket assembly can optionally include a third plurality of contact members that create a plurality of third forces and a fourth plurality of contact members that create a plurality of fourth forces, wherein the third plurality of forces generally oppose the fourth plurality of forces.

The first plurality of forces can be oriented generally toward or away from the second plurality of forces. In some embodiments the first plurality of forces are opposed by the minor beams. The distal ends of the minor beams may or may not electrically couple with the ball grid array. The balls in the ball grid array include a distal surface located beyond a widest cross-section generally parallel to a lower surface of the first circuit member. The distal ends of the minor beams preferably electrically couple with the distal surface of the balls in the ball grid array.

The contact member can be a homogeneous material or a multi-layered structure. The first and second plurality of contact members are preferably mechanically coupled with the housing. The side walls in the through openings may limit deflection of the major beams.

The distal ends of the major beams preferably include an engagement feature adapted to engage with balls in the ball grid array, such as for example a recess adapted to engage with balls in the ball grid array.

The housing can be a single unitary structure or a plurality of layers. In embodiments where the housing includes a plurality of layers, at least one layer in the housing can be a circuit layer.

DETAILED DESCRIPTION OF THE INVENTION

The present invention is directed to a high performance socket for a BGA device with a low insertion force. Use of the present socket assembly permits manufactures to install expensive IC devices during system build, providing the opportunity to later customize the system without stocking substitute circuit boards. The use of the present socket assembly allows new IC devices to replace initial release IC devices in the field (or at OEM) without the need for disassembling the system or reworking the circuit board. Trends towards lead-free electronics also increase the attractiveness of the present socket assembly.

The present socket assembly accommodates wide range of pin counts. In some embodiments, the pin counts are in the range of about 1000-2500 I/O at 1.27 mm pitch or less, and more preferably a pitch of about 0.8 millimeter or less, and most preferably a pitch of about 0.5 millimeter or less. Such fine pitch interconnect assemblies are especially useful for communications, wireless, and memory devices.

Figure 1:
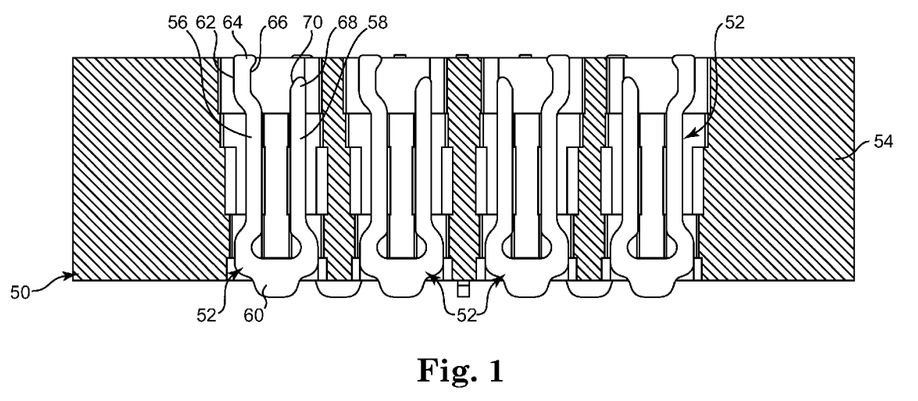
FIG. 1 is a side sectional view of a low-insertion force socket assembly in accordance with an embodiment of the present invention.

FIG. 1 is a side sectional view of a low insertion force socket assembly 50 in accordance with an embodiment of the present invention. An array of contact members 52 are retained in housing 54 using a variety of techniques discussed below. The housing 54 can be constructed from a variety of dielectric or insulating materials, such as for example, a polyethylene, lightweight polyester composites, polyvinylchloride, Kapton® polyimide film, or polytetrafluoroethelyne (PTFE).

The contact members 52 include a generally U-shaped configuration with a pair of beams 56, 58 joined at a center portion 60. Distal end 62 of the beam 56 includes an engagement feature 64. In the illustrated embodiment, the engagement feature 64 is a protrusion and an associated recess 66 adapted to at least partially engage with solder ball 72 on a circuit member 74 (see FIG. 2A). Distal end 68 of the beam 58, on the other hand, includes a tapered engagement surface 70. The contact members 52 can be any conductive material, such as for example gold, copper, or BeCu.

Figure 2A:
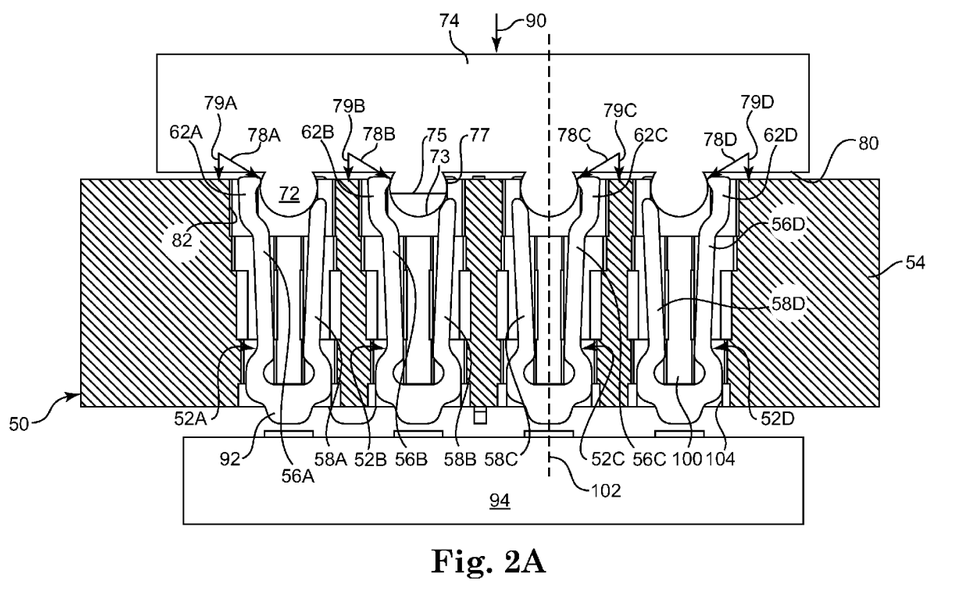
FIG. 2A is a side sectional view of the socket assembly of FIG. 1 electrically coupled to first and second circuit members.

As best illustrated in FIG. 2A, the pair of beams 56, 58 on the contact member 52 preferably do not compressively engage the solder balls 72 on first circuit member 74. Rather, a plurality of contact members 52A, 52B are positioned so that a plurality of major beams 56A, 56B generate opposing forces 78A, 78B on the solder balls 72. The distal ends 68 of the minor beams 58 preferably contact distal surface 73 of the solder balls 70 located below equator or widest cross-section 75 parallel to lower surface 80 of the first circuit member 74.

As the first circuit member 74 is brought into compressive relationship with the housing 54, distal ends 62 of the contact member 52 are displaced towards side walls 82 of the housing 54. The sidewalls 82 may limit the displacement of the distal ends 62. Since only the major beams 56 initially engage with the solder balls 72, the insertion force 90 is preferably reduced by about 50% relative to a two-beam capture system, while preserving the redundant electrical path provided by the minor beams 58. The insertion force 90 can be further reduced by decreasing the cross-sectional area of the contact members 52, increasing the length of the major beams 56, a combination thereof, or via other means (e.g., using different materials).

As used in relation to forces acting on a BGA device in a socket assembly, "opposing" or "opposed" refers to forces that act against or counteract each other to some degree, and not to a specific orientation or geometry of the forces. For example, in the embodiment of FIG. 2, the forces 78 are not parallel or directly opposed, although parallel and/or directly opposed forces are encompassed by the various embodiments and the terms opposing and opposed.

In the illustrated embodiment, the distal ends 62A, 62B, 62C, 62D (collectively "62") of the major beams 56A, 56B, 56C, 56D (collectively "56"), respectively, engage the solder balls 72 in region 77 between the equator or widest cross-section 75 and the lower surface 80 of the first circuit member 74. Due to the curved shape of the solder balls 72 in the region 77, vertical components 79A, 79B, 79C, 79D (i.e., generally perpendicular to the surface 80) of the forces 78A, 78B, 78C, 78D, respectively, are engagement forces that biases the first circuit member 74 generally toward the socket assembly 50.

Figure 5:
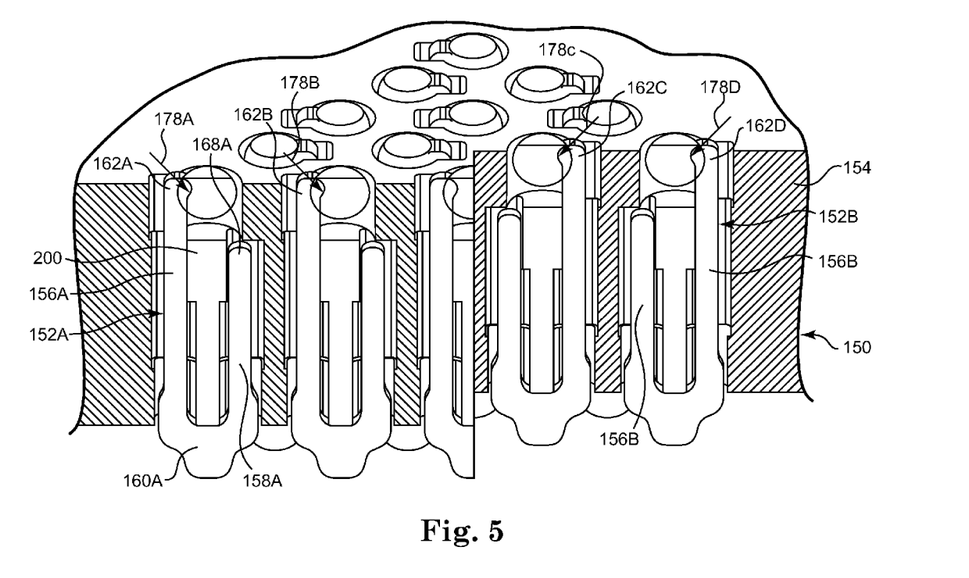
FIG. 5 is a perspective view of an alternate low-insertion force socket assembly in accordance with an embodiment of the present invention.
Figure 6:
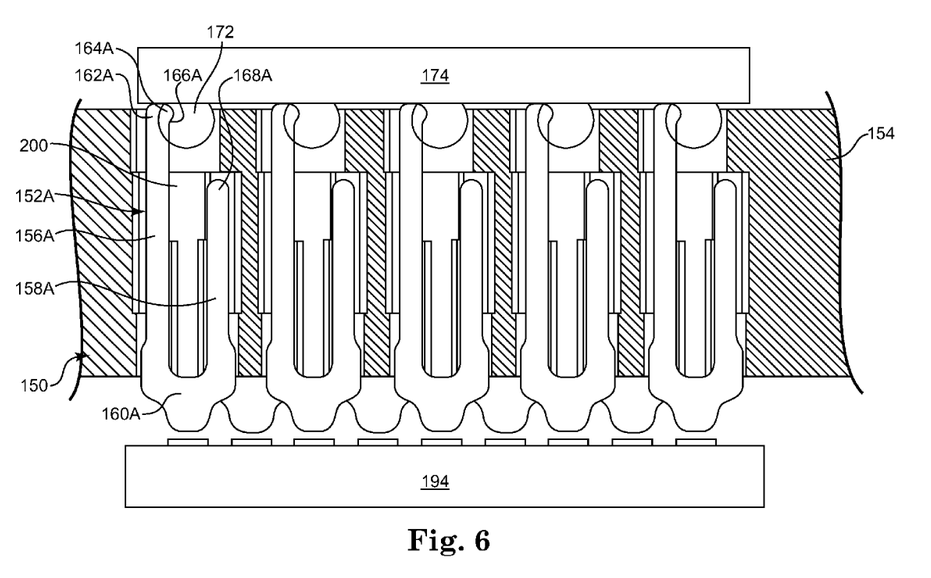
FIG. 6 is a side sectional view of the socket assembly of FIG. 5 electrically coupled to first and second circuit members.

In the embodiment of FIG. 2A, the distal ends 68 of the minor beams 58 engage the solder balls 72 in the region 73 below the equator or widest cross-section 75. Consequently, minor beams 58 do not contribute to the engagement forces 79 that bias the circuit member 74 toward the socket assembly 50. The distal ends 68 of the minor beams 58 are also deflected by the solder balls 72. In an alternate embodiment, the distal ends 68 are not deflected by the solder balls 72. In the embodiment of FIGS. 5 and 6, the distal ends 168 do not contact the solder balls 172. The distal ends 68, 168 of the minor beams 58, 158 are preferably configured to minimize the insertion force 90.

By reconfiguring the distal end 62 of the major beams 56, the angle of the forces 78 relative to the surface 80 of the first circuit member 74 can be modified. For example, by increasing the angle of the forces 78 relative to the surface 80, the vertical components 79 are also increased, providing a greater engagement force 79.

Figure 2B:
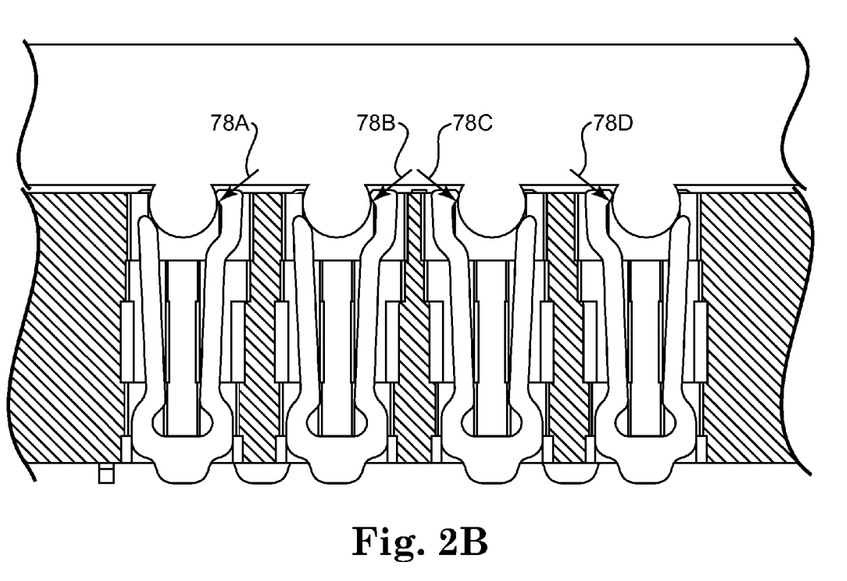
FIG. 2B is a side sectional view of the socket assembly generally as illustrated in FIG. 1 with the contact members rotated 180 degrees.

In the embodiment of FIG. 2A, the forces 78A, 78B generally act toward the opposing forces 78C, 78D. FIG. 2B illustrates an alternate embodiment with the contact members 52 rotated 180 degrees. Consequently, the opposing forces 78A, 78B act generally away from the forces 78C, 78D.

The major beams 56 also restrict sideways movement of the first circuit member 74 relative to the socket assembly 50. In the illustrated embodiment, the minor beams 58A, 58B, 58C, 58D (collectively "58") preferably contact the solder balls 72 to provide a redundant electrical path. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

Center portion 60 preferably includes a distal end 92 configured to electrically couple with a second circuit member 94. The distal end 92 can be configured to electrically couple with a wide variety of circuit members, including for example a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), a chip scale package (CSP), or packaged or unpackaged integrated circuits. Each distal end 92 may also include a solder ball that may be reflowed to connect the socket assembly 54 to the second circuit member 94.

The housing 54 can be a unitary structure or a layered structure. A layered housing permits internal features that would normally be impossible to mold or machine. For large pin count devices, the laminating process produces an inherently flat part without requiring molds. Stiffening layers made of materials such as BeCu, Cu, ceramic, or polymer filled ceramic can be added to provide additional strength and to provide thermal stability during solder reflow. A multi-layered housing can also include circuitry layers. Power, grounding and/or decoupling capacitance can be added between layers or between pins, and unique features such as embedded IC devices or RF antennae can optionally be incorporated.

In the illustrated embodiment, the housing 54 includes center members 100 that helps position the contact members 52. The center members 100 are preferably oriented along axis 102 of openings 104 in the housing 54, permitting some movement of the contact members 52 along the axis 102. In some embodiments, the beams 56, 58 compressively engage with the center member 100 to retain the contact members 52 in the housing 54. The contact members 52 can be press fit into the housing 54. A post insertion solder mask (as done on printed circuit boards and IC packages) can also be added to improve solder deposit formation and wick prevention. The center member 100 can also act as a stop for the minor beams 58 when the major beams 56 are deflected by the first circuit member 74.

The sizes and shape of the openings 104 and the center member 100 can be adjusted so as to permit the contact member 52 some movement relative to the housing 54. Movement of the contact member 52 along longitudinal axis 102 is of particular interest in obtaining consistent and reliable electrical coupling with the circuit members 74, 94.

Figure 3:
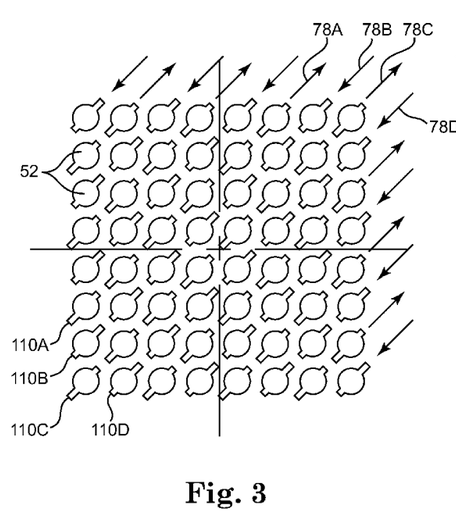
FIG. 3 is a schematic illustration of an array of contact members in accordance with an embodiment of the present invention.
Figure 4:
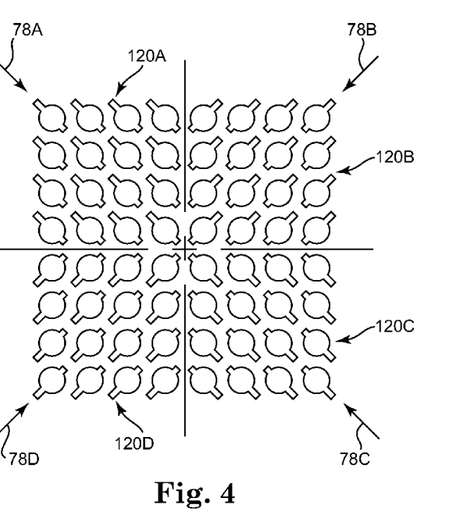
FIG. 4 is a schematic illustration of an array of contact members in accordance with an alternate embodiment of the present invention.

Various alternate housings and contact member configurations are disclosed in U.S. Pat. Nos. 6,830,460, 6,939,143, 6,957,963, 7,114,960, 7,121,839, 7,160,119, 7,297,003, 7,326,064, and 7,422,439, which are hereby incorporated by reference FIGS. 3 and 4 illustrate various configurations of the contact members 52 in accordance with embodiments of the present invention. In the embodiment of FIG. 3, the contact members 52 are arranged in diagonal rows 110A, 110B, 110C, 110D, etc. (collectively, "110"). The contact members 52 are oriented in the rows 110 so that the forces 78A, 78B, 78C, 78D, etc. (collectively "78") alternate direction every other row 110. In the embodiment of FIG. 4, the contact members 52 are arranged in four quadrants 120A, 120B, 120C, 120D. The forces 78A in quadrants 120A opposing the forces 78C in 120C, while the forces 78B in quadrant 120B opposing the forces 78D in quadrant 120D.

FIGS. 5 and 6 illustrate a perspective and side sectional views of an alternate socket assembly 150 in accordance with an alternate embodiment of the present invention. Circuit members 174 and 194 are not shown in FIG. 5 for clarity.

An array of contact members 152A, 152B, 152C, 152D, etc. (collectively "152") are retained in housing 154 using any of the techniques discussed herein. The contact member 152A includes a generally U-shaped configuration with a pair of beams 156A, 158A joined at a center portion 160A. Distal end 162A of the major beam 156A includes engagement feature 164A. In the illustrated embodiment, the engagement feature 164A is a protrusion and an associated recess 166A adapted to at least partially engage with a solder ball 172 on circuit member 174 (see FIG. 6). Distal end 168A of the beam 158A, on the other hand, is retained in the housing 154 and does not engage with the solder ball 172. Each of the contact members 152 preferably has the features of contact member 152A.

As best illustrated in FIG. 5, the distal ends 162A, 162B, 162C, 162D, etc. (collectively "162") of the major beams 156A, 156B, 156C, 156D, etc. (collectively "156") are arranged to generate generally opposing forces 178A, 178B, 178C, 178D, etc. (collectively "178") The minor beams 158A, 158B, 158C, 158D, etc. (collectively "158") preferably engage with center members 200 on the housing 154 to oppose the forces 178. As discussed above, the forces 178 are not necessarily parallel. The forces 178 preferably bias the first circuit member 174 generally downward toward the socket assembly 150.

Figure 7:
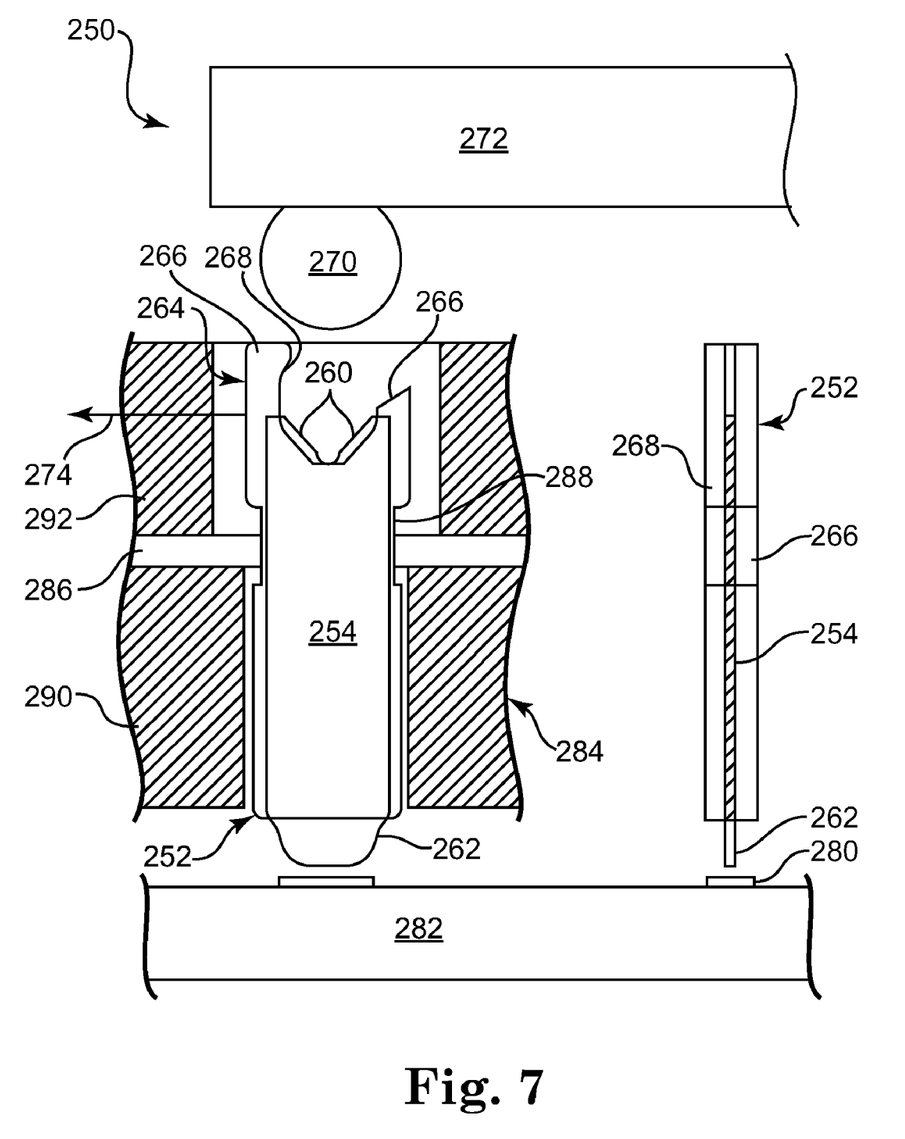
FIG. 7 is a side sectional view of a low-insertion force socket assembly with a layered contact member in accordance with an embodiment of the present invention.

FIG. 7 illustrates an alternate socket assembly 250 with a multi-layers contact member 252. In the illustrated embodiment, conductive member 254 is sandwiched between the polymeric layers 256, 258, leaving at least a portion of the side edges of the conductive member 254 exposed. For example, the side edges of one or more of the conductive members 254 may be exposed in the region 288 so as to be able to electrically couple with intermediate circuit layer 286. Preferably, however, the conductive member 254 is substantially encapsulated or surrounded between the polymeric layers 256, 258, except for the exposed first interface portion 260 and second interface portion 262.

The polymeric layers 256, 258 are preferably fused or bonded such that they resemble a contiguous piece. The polymeric layers 256, 258 can also be mated with the use of adhesive, mechanical fusion, melting of the base material or a seed layer, or even deposition techniques used in semiconductor packaging or circuit manufacturing processes. The polymeric layers 256, 258 provide controlled or designed mechanical properties that can be modified based upon the required geometries. The conductive member 254 can be printed, etched, laser cut, stamped or molded either prior to lamination or even after to create features or geometries that provide the desired function. In one embodiment, the conductive member 254 is formed directly on one of the polymeric layers 256, 258, such as for example by printing or etching. The opposing polymeric layer is then laminated over the conductive member 254.

Portions 264 of the polymeric layers 256, 258 form engagement features 266. In the illustrated embodiment, the engagement feature 266 includes recesses 268 having a shape generally corresponding a shape of solder ball 270 on the first circuit member 272. A plurality of the contact members 254 are arranged to create the opposing forces described in connection with FIGS. 1 through 6. As the first circuit member 272 is pressed towards the interconnect assembly 250, the engagement feature 266 flex outward in direction 274 until the solder ball 270 is engaged with the recess 268.

Since the solder ball 270 is engaging with plastic portions 264, the insertion force can be relatively small. Additionally, the plastic engagement feature 266 does not form a groove or otherwise damage the solder ball 270 during insertion. The present composite contacts permit an insertion process that places little or no mechanical stress on the relatively thin conductive member 254.

Second interface portion 262 is configured to electrically couple with contact pads 280 on the second circuit member 282. The polymeric layers 256, 258 prevent solder around the second interface portion 262 from wicking up into housing 284.

In the illustrated embodiment, housing 284 is a multi-layered structure. Coupling layer 284 engages with coupling feature 28 on the composite contact 252. In the illustrated embodiment, the coupling feature 288 is a narrow region that interlocks or couples with the coupling layer 286. Alternatively, the coupling feature 288 can be a protrusion, an irregular or asymmetrical edge, or a variety of other structures that are adapted to engage with the housing 284.

Alignment layer 290 serves to position the second interface portion 262 in a pre-determined location that corresponds with contact pads 280 on the second circuit member 282. Stabilizing layer 292 limits the deflection of the engagement feature 266 in the direction 274. The layers 286, 290, 292 can be selectively bonded or non-bonded to provide contiguous material or releasable layers. As used herein, "bond" or "bonding" refers to, for example, adhesive bonding, solvent bonding, ultrasonic welding, thermal bonding, or any other techniques suitable for attaching adjacent layers of the housing. In an alternate embodiment, a monolithic or single layer housing can be used. The layers 286, 290, 292 can be constructed from the same or multiple material types.

The housing 284 may be constructed of a dielectric material, such as plastic. Suitable plastics include phenolics, polyesters, and Ryton® available from Phillips Petroleum Company. Alternatively, the housing 284 may be constructed from metal, such as aluminum, with a non-conductive surface, such as an anodized surface. For some applications, the metal housing may provide additional shielding of the composite contacts. In an alternate embodiment, the housing is grounded to the electrical system, thus providing a controlled impedance environment. Some of the composite contacts can be grounded by permitting them to contact an uncoated surface of the metal housing.

The discrete layers 286, 290, 292 can be etched or ablated and stacked without the need for expensive mold tooling. The layers 286, 290, 292 can create housing features that have a much larger aspect ratio than typically possible with molding or machining The layers 286, 290, 292 also permit the creation of internal features, undercuts, or cavities that are difficult or typically not possible to make using conventional molding or machining techniques, referred to herein as a "non-moldable feature." The present housings also permit stiffening layers, such as metal, ceramic, or alternate filled resins, to be added to maintain flatness where a molded or machined part might warp.

The layers 286, 290, 292 of the housing 284 can also optionally include circuitry, such as disclosed in U.S. patent Ser. No. 11/130,494 entitled Compliant Interconnect Assembly, filed May 17, 2005, which is hereby incorporated by reference. Power, grounding and/or decoupling capacitance can be added to or between the layers 286, 290, 292, or between pins, and unique features such as embedded IC devices or RF antennae can optionally be incorporated. In some cases, additional layers can be used to assist with device insertion or removal, such as with ZIF or stripper plate actuation mechanisms. Consequently, the interconnect assembly 250 can be enhanced in ways not possible using conventional molding or machining techniques.

In one embodiment, layer 286 is a circuit layer, such as for example a ground plane or power plane. The circuit layer 286 can optionally electrically couple to conductive member 254 proximate the coupling feature 288. Selectively coupling the composite contacts 252 to the circuit layer 286 permits the interconnect assembly 250 to provide connectivity not readily available with current connector structures.

The socket assemblies disclosed herein permit the creation of high aspect ratio through holes and slots with internal cavities having non-moldable features, to allow for contact flexure clearance, on fine contact to contact spacing (pitch). The socket assemblies provide the ability to press-fit the composite contacts into lower layers to position, point and retain the composite contacts and seal the interface to prevent solder or flux wicking during reflow. A post insertion solder mask (as done on printed circuit boards and IC packages) can also be added to improve solder deposit formation and wick prevention.

The socket assemblies disclosed herein can optionally be designed to receive multiple circuit members, such as the replaceable chip modules disclosed in U.S. Pat. Nos. 5,913,687; 6,178,629; and 6,247,938, all of which are incorporated by reference.

EXAMPLE

Figure 8:
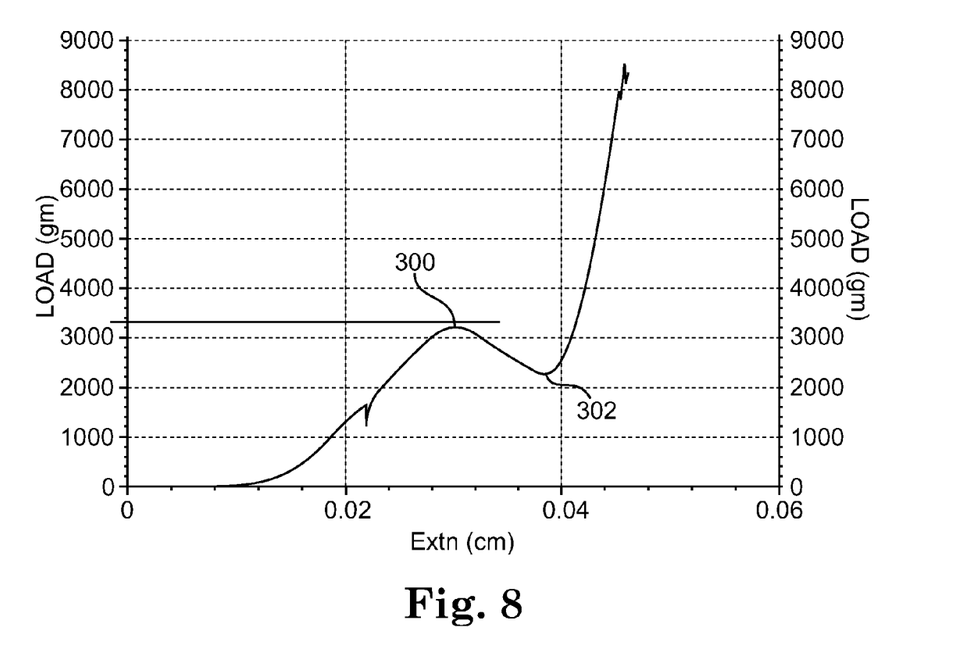
FIG. 8 is a force vs. displacement graph of insertion force for an exemplary socket assembly in accordance with an embodiment of the present invention.

FIG. 8 is a force vs. displacement curve during insertion of a BGA device into a socket assembly generally as illustrated in FIGS. 1 and 2. The socket assembly has 208 contact members, each 0.1 millimeters thick. The contact members are constructed from a metal alloy.

The contact members are arranged in opposing quadrants such as illustrated in FIG. 4. The initial insertion force was about 20 grams per contact. The socket assembly was exposed to about 50 insertion cycles, after which the insertion force settled at about 16 grams per contact, or a total insertion force of about 3400 grams.

The location 300 on the graph illustrates the peak insertion force at maximum ball diameter. The location 302 on the graph illustrates the force exerted by the beams once the BGA device is seat on the socket assembly.

Where a range of values is provided, it is understood that each intervening value, to the tenth of the unit of the lower limit unless the context clearly dictates otherwise, between the upper and lower limit of that range and any other stated or intervening value in that stated range is encompassed within the inventions. The upper and lower limits of these smaller ranges which may independently be included in the smaller ranges is also encompassed within the inventions, subject to any specifically excluded limit in the stated range. Where the stated range includes one or both of the limits, ranges excluding either both of those included limits are also included in the inventions.

Unless defined otherwise, all technical and scientific terms used herein have the same meaning as commonly understood by one of ordinary skill in the art to which these inventions belong. Although any methods and materials similar or equivalent to those described herein can also be used in the practice or testing of the present inventions, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present inventions are not entitled to antedate such publication by virtue of prior invention. Further, the dates of publication provided may be different from the actual publication dates which may need to be independently confirmed.

Other embodiments of the invention are possible. Although the description above contains many specificities, these should not be construed as limiting the scope of the invention, but as merely providing illustrations of some of the presently preferred embodiments of this invention. It is also contemplated that various combinations or sub-combinations of the specific features and aspects of the embodiments may be made and still fall within the scope of the inventions. It should be understood that various features and aspects of the disclosed embodiments can be combined with or substituted for one another in order to form varying modes of the disclosed inventions. Thus, it is intended that the scope of at least some of the present inventions herein disclosed should not be limited by the particular disclosed embodiments described above.

Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

What is claimed is:

1. A socket assembly for electrically interconnecting a ball grid array on a first circuit member with terminals on a second circuit member, the socket assembly comprising:
   a housing comprising a plurality of through openings that extend between opposite surfaces of the housing;
   a first plurality of contact members positioned in a plurality of the through openings, the first plurality of contact members each comprising major beams and minor beams with proximal ends attached to a center portion, and distal ends extending away from the center portion, the major beams comprising a length greater than the minor beams, wherein when the first circuit member is engaged with the socket assembly the ball grid array displaces the distal ends of the major beams of the first plurality of contact members to create a plurality of first forces;
   a second plurality of contact members positioned in a plurality of the through openings, the second plurality of contact members each comprising major beams and minor beams with proximal ends attached to a center portion, and distal ends extending away from the center portion, the major beams comprising a length greater than the minor beams, wherein when the first circuit member is engaged with the socket assembly the ball grid array displaces the distal ends of the major beams of the second plurality of contact members to create a plurality of second forces, wherein the first plurality of forces generally oppose the second plurality of forces; and
   wherein the first and second plurality of forces generate an engagement force that biases the first circuit member toward the housing, wherein the minor beams on the first and second plurality of contact members do not contribute to the engagement force.

2. The socket assembly of claim 1 comprising:
   a third plurality of contact members positioned in a plurality of the through openings, wherein when the first circuit member is engaged with the socket assembly the ball grid array displaces the distal ends of the major beams of the third plurality of contact members to create a plurality of third forces; and
   a fourth plurality of contact members positioned in a plurality of the through openings, wherein when the first circuit member is engaged with the socket assembly the ball grid array on displaces the distal ends of the major beams of the fourth plurality of contact members to create a plurality of fourth forces, wherein the third plurality of forces generally oppose the fourth plurality of forces.

3. The socket assembly of claim 1 wherein the first plurality of forces are oriented generally toward the second plurality of forces.

4. The socket assembly of claim 1 wherein the first plurality of forces are oriented generally away from the second plurality of forces.

5. The socket assembly of claim 1 wherein the first plurality of forces are opposed by the minor beams of the first plurality of contact members biased against the housing.

6. The socket assembly of claim 1 wherein the distal ends of the minor beams do not engage the ball grid array.

7. The socket assembly of claim 1 wherein the distal ends of the minor beams electrically couple with a distal surface of ball members on the ball grid array.

8. The socket assembly of claim 1 wherein balls in the ball grid array comprise a distal surface located beyond a widest cross-section generally parallel to a lower surface of the first circuit member, and the distal ends of the minor beams electrically couple with the distal surface of the balls in the ball grid array.

9. The socket assembly of claim 1 wherein the contact member comprises a multi-layered structure.

10. The socket assembly of claim 1 wherein distal ends of the major beams comprise an engagement feature adapted to engage with balls in the ball grid array.

11. The socket assembly of claim 1 wherein distal ends of the major beams comprise a recess adapted to engage with balls in the ball grid array.

12. The socket assembly of claim 1 wherein the first and second plurality of contact members are mechanically coupled with the housing.

13. The socket assembly of claim 1 wherein side walls in the through openings limit deflection of the major beams.

14. The socket assembly of claim 1 wherein the housing comprises a plurality of layers.

15. The socket assembly of claim 1 wherein the housing comprises a plurality of layers and at least one layer in the housing comprises a circuit layer.

16. The socket assembly of claim 1 comprising a first circuit member electrically coupled to the distal ends of the major beams and a second circuit member electrically coupled to the center portions of the contact members.

17. A socket assembly for electrically interconnecting a ball grid array on a first circuit member with terminals on a second circuit member, the socket assembly comprising:
   a housing comprising a plurality of through openings that extend between a first surface and a second surface of the housing;
   a first plurality of contact members positioned in a plurality of the through openings, the first plurality of contact members comprising major beams and minor beams with proximal ends attached to a center portion, and distal ends extending away from the center portion, the major beams comprising a length greater than the minor beams, wherein when the first circuit member is engaged with the socket assembly the ball grid array on the first circuit member displaces the distal ends of the major beams of the first plurality of contact members to create a plurality of first forces;
   a second plurality of contact members positioned in a plurality of the through openings, the second plurality of contact members comprising major beams and minor beams with proximal ends attached to a center portion, and distal ends extending away from the center portion, the major beams comprising a length greater than the minor beams, wherein when the first circuit member is engaged with the socket assembly the ball grid array on the first circuit member displaces the distal ends of the major beams of the second plurality of contact members to create a plurality of second forces, wherein the first plurality of forces generally oppose the second plurality of forces; and
   an engagement force that biases the first circuit member toward the housing generated by the first and second plurality of forces, wherein the minor beams on the first and second plurality of contact members electrically couple with a distal surface of ball members on the ball grid array.

* * * * *